(12) United States Patent
Scuderi et al.

(10) Patent No.: US 7,279,978 B2
(45) Date of Patent: Oct. 9, 2007

(54) GAIN STAGE CONTROL METHOD AND RELATED CONTROL CIRCUIT

(75) Inventors: Angelo Scuderi, Catania (IT); Antonino Scuderi, Misterbianco (IT); Luca La Paglia, Caltagirone (IT); Francesco Carrara, Acireale (IT); Giuseppe Palmisano, San Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 70 days.

(21) Appl. No.: 11/048,200

(22) Filed: Feb. 1, 2005

(65) Prior Publication Data

US 2006/0170501 A1    Aug. 3, 2006

(51) Int. Cl.
*H03G 3/10*    (2006.01)

(52) U.S. Cl. ................................. 330/285; 330/296

(58) Field of Classification Search ............... 370/285, 370/296, 133
See application file for complete search history.

(56) References Cited

U.S. PATENT DOCUMENTS

| | | | | |
|---|---|---|---|---|
| 4,413,235 A | * | 11/1983 | Jason | 330/254 |
| 6,791,418 B2 | * | 9/2004 | Luo et al. | 330/296 |
| 6,806,775 B2 | * | 10/2004 | Abe | 330/297 |

* cited by examiner

*Primary Examiner*—Henry Choe
(74) *Attorney, Agent, or Firm*—Lisa K. Jorgenson; Allen, Dyer, Doppelt, Milbrath & Gilchrist, P.A.

(57) ABSTRACT

A gain stage control method may include providing a control current signal; generating a regulation current signal connected to the control current signal; transforming the regulation current signal into a biasing current, proportional to the regulation current signal; and biasing the gain stage by using the biasing current. The biasing current may be related to the control current signal by an exponential law.

30 Claims, 6 Drawing Sheets

GAIN STAGE CONTROL METHOD AND RELATED CONTROL CIRCUIT

FIELD OF THE INVENTION

The present invention relates to a gain stage control method. The invention relates particularly, but not exclusively, to a power transistor control method and the following description is made with reference to this field of application for convenience of illustration only.

BACKGROUND OF THE INVENTION

As it is well known, components realized with integrated technologies are presently the most used to realize the power amplifiers required, for example, by mobile phones and particularly, in the field of wireless telecommunication systems. To realize these components, it may be extremely important to control the power outputted from the power amplifier for a correct operation thereof and for the operation of the other circuits connected thereto.

This control should be usually ensured in the different circuit operating conditions, both in steady operation periods and in transient periods. It is known to control the output power from an electronic circuit by feedback or closed-loop control circuits like the one shown in FIG. 1. In particular, a closed-loop power control system has been globally and schematically indicated by reference numeral 10, which has an input terminal IN1 suitable to receive an input signal RFin and an output terminal OUT1 suitable to provide an output signal RFout. In particular, the output signal RFout is a power signal to be controlled.

Figure 1:
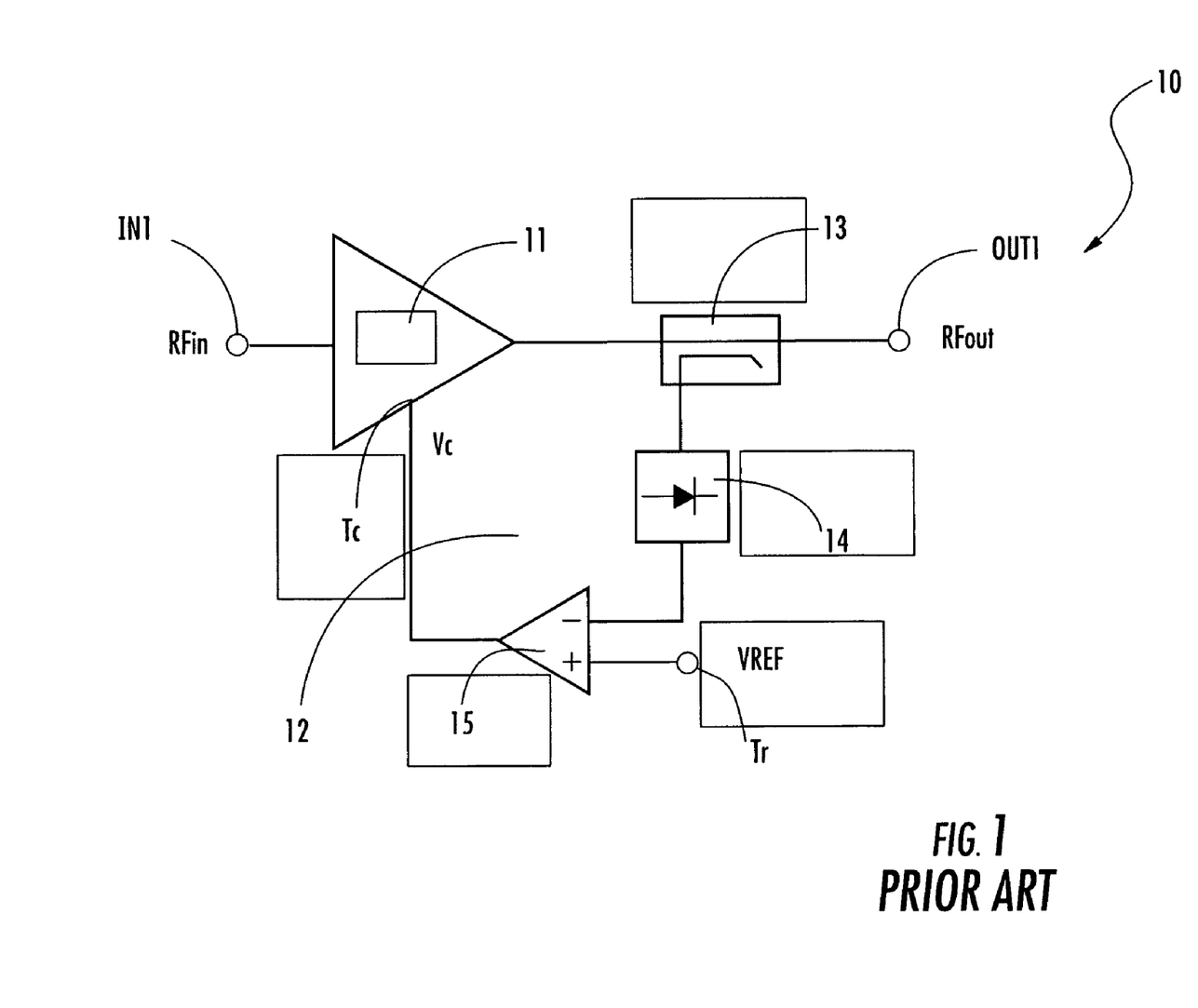
FIG. 1 schematically shows a feedback-control system realized according to the prior art.

The system 10 essentially comprises a power amplifier 11, connected between the input terminal IN1 and the output terminal OUT1, and having a control terminal Tc suitable to receive a control signal, particularly a power control voltage Vc. To control the output power signal RFout, the system 10 also comprises a control circuit realized by a feedback loop 12 connected between an output terminal and the control terminal Tc of the power amplifier In particular, the feedback loop 12 comprises a directional coupler 13 inserted between the output terminal of the power amplifier 11 and the output terminal OUT1 of the system 10 and connected to an envelope detector 14, connected, in turn, to an input terminal of an error amplifier 15 in the feedback loop 12. This error amplifier 15 has a further input terminal Tr connected to a reference signal, particularly to a reference voltage Vref, as well as an output terminal suitable to provide the control voltage Vc to the control terminal Tc of the power amplifier 11. It should be noted that this reference voltage Vref is essentially a feedback control signal set according to the control of the output power signal RFout to be obtained.

In summary, the system 10 latches, by the feedback loop 12, the output voltage from the envelope detector 14 to the reference voltage Vref, thus controlling the output power signal RFout as this reference voltage Vref varies. In particular, the feedback loop 12 forces the output voltage from the envelope detector 14 so that it is equal to the reference voltage Vref.

Although advantageous under several aspects, this first feedback approach has several drawbacks including:

a power loss, a high complexity and a cost increase of the system as a whole linked to the presence of the directional coupler 13;

a dynamic control range limitation due to the presence of the envelope detector 14, which comprises, as it is well known, at least a diode; and during the power signal regulation transients, a considerable variation of the feedback system loop gain within the control dynamics, with the subsequent possible instability problems.

Figure 2:
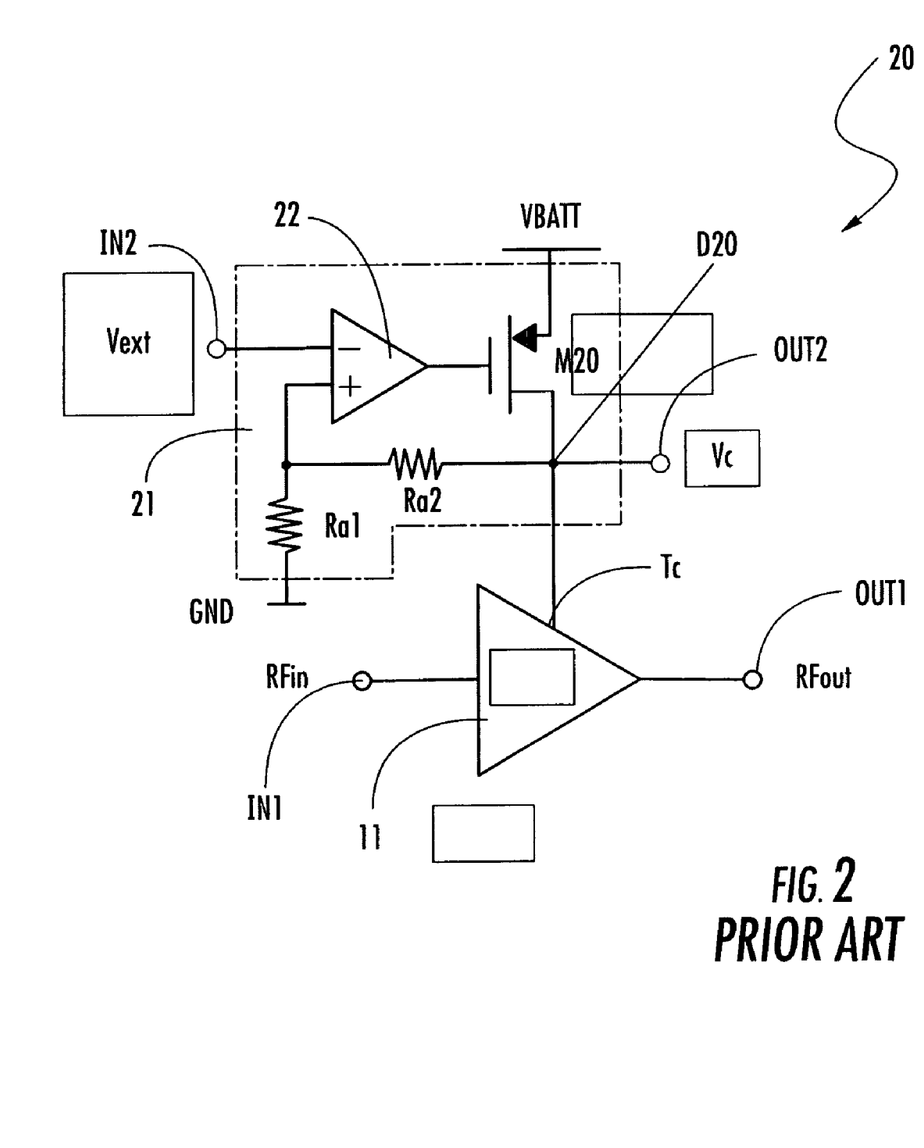
FIG. 2 schematically shows a linear-control system realized according to the prior art.

A second approach described, for example, by D. Brunel et al. in: "Power control with the MRFIC0913 GaAs IPA and MC33169 support IC", Motorola Semiconductors application note AN1599, 2000, provides the use of a voltage regulator connected to an external control voltage, as shown in FIG. 2. In particular, this FIG. 2 globally shows a system 20 comprising, as for the example of FIG. 1, a power amplifier 11, connected between an input terminal IN1 and an output terminal OUT1 and having a control terminal Tc suitable to receive a control signal, in particular a power control voltage Vc. This control terminal Tc is connected to an output terminal OUT2 of a voltage regulator 21, inserted, in turn, between a first and second voltage reference, in particular a power supply $V_{BATT}$ and a ground GND, and having an input terminal IN2 receiving an external control voltage Vext.

It should be noted that this external control voltage Vext is essentially a regulation signal of the amplifier 11 regulated according to the control of the output power signal RFout to be obtained. The voltage regulator 21 essentially comprises an error amplifier 22 having a first input terminal, in particular the inverting input terminal (−), connected to the input terminal IN2 of the regulator 21, as well as an output terminal connected to a control terminal of a power transistor M20, inserted, in turn, between the supply voltage terminal $V_{BATT}$ and the output terminal OUT2 of the regulator 21. It is known to use a P-channel MOS transistor as a power transistor. The error amplifier 22 has also a further input terminal, in particular the non-inverting input terminal (+), connected, by a first resistive element Ra1, to the ground GND, as well as, by a second resistive element Ra2, to the output terminal OUT2 of the regulator 21.

Essentially, the signal being outputted from the error amplifier 22, applied to the control terminal of the power transistor M20, allows the voltage at the drain terminal D20 to be linearly varied when the external control voltage Vext varies and, subsequently, a variation of the range allowed when the signal is present is obtained, when the control terminal Tc is used as a supply terminal of the amplifier 11. The linear regulator 21 thus allows the required power control voltage Vc to be obtained and the power output signal RFout of the amplifier 11 to be regulated.

It should be noted that the use of the linear regulator 21 allows the output power to be set without using a feedback loop, avoiding the losses due to the presence of the directional coupler being required with the feedback control, as previously seen with reference to the example of FIG. 1.

This approach has some drawbacks including:

it is necessary to use a power transistor having a low turn-on resistance RDS(ON) to reduce the efficiency loss in the highest output power condition;

when the power transistor is an external component, the presence thereof involves additional costs and a higher complexity of the system construction;

when the power transistor is integrated with the amplifier 11, the silicon area occupation of the system as a whole is penalized; and the linear voltage control performed by the linear regulator 21 determines a high control curve slope in correspondence with low output power levels, since a linear function results in a logarithmic function when expressed in dB/V.

SUMMARY OF THE INVENTION

An embodiment of this invention is directed to a control method of the electronic circuit output power and a corresponding control circuit, having such structural and functional features as to allow the limitations and drawbacks still affecting prior art systems to be overcome.

The gain stage control method may comprise: providing a control current signal; generating a regulation current signal related to the control current signal; transforming the regulation current signal into a biasing current, proportional to it; and biasing the gain stage by using the biasing current. The biasing current may be related to the control current signal ($I_{CTRL}$) by an exponential law.

In one embodiment, the exponential law is of the type:

$$I_{POL} = K_1 exp(K_2 I_{CTRL})$$

with:
$I_{POL}$ = the biasing current
$I_{CTRL}$ = the control current signal and
$K_1$ and $K_2$ = multiplicative constants.

Also, according to another embodiment the control current signal may be of the PTAT type. A further embodiment of this invention is directed to an output power control circuit of a gain stage inserted between a first and second voltage reference and having an input terminal suitable to receive a control voltage signal and an output terminal suitable to provide a regulation current signal to an input terminal of a biasing circuit. The biasing circuit has, in turn, an output terminal suitable to provide a biasing current to a control terminal of the gain stage. The biasing circuit generates the biasing current signal according to a linear relation with respect of the regulation current signal and the control circuit generates the regulation current signal starting from a control voltage signal according to an exponential law.

In one embodiment, the control circuit further comprises at least one operational amplifier having a first input terminal connected to a control terminal of an input transistor, a second input terminal connected to the input terminal, as well as an output terminal connected to a control terminal of an output transistor, inserted, in turn, between the output terminal and the second voltage reference.

The features and advantages of the method and control circuit according to the invention will be apparent from the following description of embodiments thereof given by way of non-limiting examples with reference to the attached drawings.

DETAILED DESCRIPTION OF THE PREFERRED EMBODIMENTS

Figure 3:
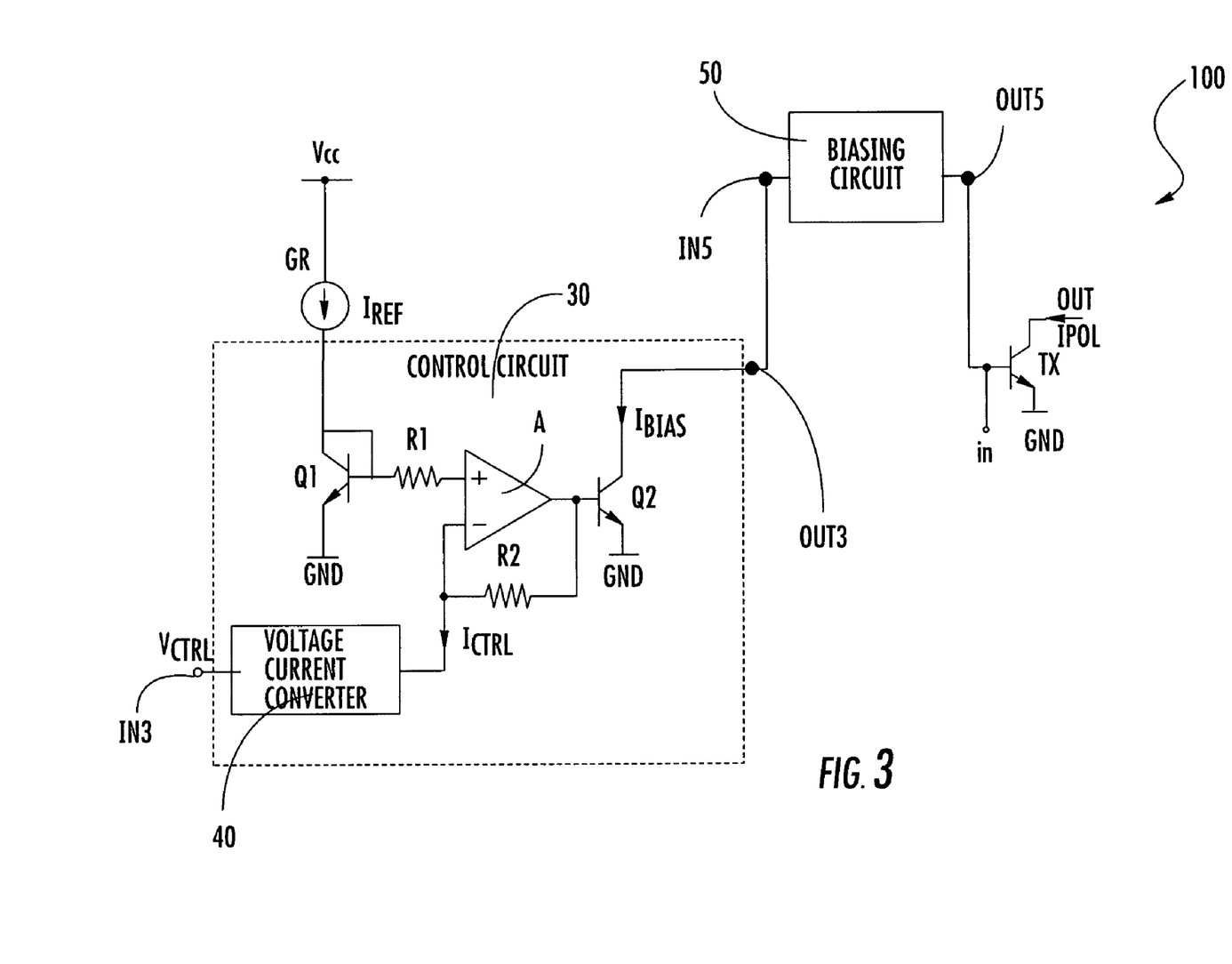
FIG. 3 schematically shows a control circuit suitable to implement the control method according to an embodiment of the invention.

With reference to the figures, and particularly to FIG. 3, a control circuit suitable to implement the control method according to an embodiment of the invention is globally and schematically indicated with 30. The control circuit 30 is inserted between a first voltage reference, particularly a supply voltage Vcc, and a second voltage reference, particularly a ground GND, and it has an input terminal IN3 receiving a control voltage $V_{CTRL}$ and an output terminal OUT3 connected to an input terminal IN5 of a biasing circuit 50.

The biasing circuit 50 further has an output terminal OUT5 connected to a control terminal in of a power transistor TX. More generally, this power transistor TX is a system gain stage whose output power is to be controlled, such as for example a power amplifier for telecommunication systems. As a whole, the combination of the control circuit 30, the biasing circuit 50 and of the power transistor TX is indicated as the controlled system 100.

The power transistor TX is indicated as inserted between a generic output terminal out of the controlled system 100 and ground GND. Advantageously according to an embodiment of the invention, the control circuit 30 allows a gain stage control method to be implemented by varying a biasing current $I_{POL}$ of a power transistor.

In particular, the control method of the power transistor output power according to an embodiment of the invention includes: providing a control voltage signal $V_{CTRL}$; converting the control voltage signal $V_{CTRL}$ into a control current signal $I_{CTRL}$, this control current signal $I_{CTRL}$ having a linear relation with the control voltage signal $V_{CTRL}$ and being directly proportional thereto; and generating a regulation current signal $I_{BIAS}$ related to the control current signal $I_{CTRL}$ according to an exponential law; transforming the regulation current signal $I_{BIAS}$ into a biasing current $I_{POL}$ proportional to it; and biasing the gain stage by using the biasing current $I_{POL}$.

Advantageously according to an embodiment of the invention, the exponential law relating the regulation current signal $I_{BIAS}$ to the control current signal $I_{CTRL}$ is of the type:

$$I_{BIAS} = K_1 exp(K_2 I_{CTRL}) \qquad (1)$$

with $K_1$ and $K_2$ being multiplicative constants linked to typical parameters of a control circuit suitable to implement the method according to an embodiment of the invention. Also the biasing current $I_{POL}$ of the gain stage, which is derived from the regulation current signal $I_{BIAS}$ will show an exponential trend with respect to the control current signal $I_{CTRL}$.

It should be noted that the use of an exponential correlation law between the biasing current $I_{POL}$ and the control current $I_{CTRL}$ derived from the control voltage $V_{CTRL}$ advantageously allows the slope of the corresponding gain stage control curve to be reduced when expressed in dB/V. In fact, as seen with reference to prior art circuits, a linear connection between the biasing current $I_{BIAS}$ of a power transistor and the control current $I_{CTRL}$ (and thus the control current $V_{CTRL}$) is not very suitable in several applications, and particularly in telecommunication systems, since it does not allow the control curve slope expressed in dB/V to be minimized.

In a preferred embodiment of the control method, this control current signal $I_{CTRL}$ is also selected to be proportional to the absolute temperature value, i.e. a so-called PTAT (acronym from: "Proportional To Absolute Temperature") current. In particular, a first steady-temperature current signal $I_1$ and a second PTAT current signal $I_2$ are used and a control current $I_{CTRL}$ is obtained according to the law:

$$I_{CTRL} = K_3 \frac{I_2}{I_1} V_{CTRL} \qquad (2)$$

with $K_3$ being a multiplicative constant linked to typical parameters of a voltage-current converter in a control circuit suitable to implement this preferred embodiment of the control method according to an embodiment of the invention.

The control circuit 30 shown in FIG. 3 allows the just described control method to be implemented. To this purpose, this control circuit 30 comprises an operational amplifier A having a first input terminal, particularly a non-inverting input terminal (+) connected, by a first resistor R1, to a control terminal of an input transistor Q1. In particular, the input transistor Q1 is diode-configured and biased by a generator Gr of a steady-temperature current $I_{REF}$.

The operational amplifier A has a second input terminal, particularly the inverting input terminal (−), connected, by a voltage-current converter 40, to the input terminal IN of the control circuit 30. In particular, the voltage-current converter 40 turns the input control voltage value $V_{CTRL}$ into an output control current value $I_{CTRL}$.

Advantageously according to an embodiment of the invention, the control circuit 30 also comprises an output transistor Q2, inserted between the output terminal OUT3 thereof and ground GND, and having a control terminal connected to an output terminal of the operational amplifier A. This output terminal of the operational amplifier A is also feedback-connected to the non-inverting input terminal (−) by a second resistor or feedback-resistor R2. Advantageously, the value of the first resistor R1 is selected to be equal to the value of the second resistor R2 to compensate the bias current effect at the operational amplifier A input.

The current value $I_{BIAS}$ at the output terminal OUT3 of the control circuit 30 is thus given by:

$$I_{BIAS} = \frac{A_{E2}}{A_{E1}} I_{REF} \exp\left(R_2 \frac{I_{CTRL}}{V_T}\right) \qquad (3)$$

with $A_{E1}$ and $A_{E2}$=the emitter areas of the transistors Q1 and Q2, respectively;

$I_{REF}$=the reference current value provided by the biasing generator to the input transistor Q1;

R2=the value of the feedback resistor of the operational amplifier A;

$I_{CTRL}$=the control current value applied to the inverting input terminal of the operational amplifier A; and $V_T$=the thermal voltage (equal to KT/q with K being the Bolzmann constant, T the absolute temperature and q the electron charge).

Advantageously according to an embodiment of the invention, the biasing circuit 50 sets a biasing current $I_{POL}$ for the power transistor TX, which current is proportional to the input received current $I_{BIAS}$, according to the law:

$$I_{POL} = K_4 I_{BIAS} \qquad (4)$$

with $K_4$ being a steady-temperature proportional and thus:

$$I_{POL} = K_4 \frac{A_{E2}}{A_{E1}} I_{REF} \exp\left(R_2 \frac{I_{CTRL}}{V_T}\right)$$

So, a biasing current value $I_{POL}$ of the power transistor TX is obtained which current is linked to the control current value $I_{CRTL}$, and thus to the control voltage value $V_{CTRL}$, by an exponential law. Advantageously according to an embodiment of the invention, the control current $I_{CTRL}$ is obtained as linked to the $V_{CTRL}$ according to a linear relation by using the voltage-current converter 40. In a preferred embodiment of the invention, this control current $I_{CTRL}$ is also selected of the PTAT type and obtained by a translinear voltage-current converter 40, as shown for example in FIG. 4.

Figure 4:
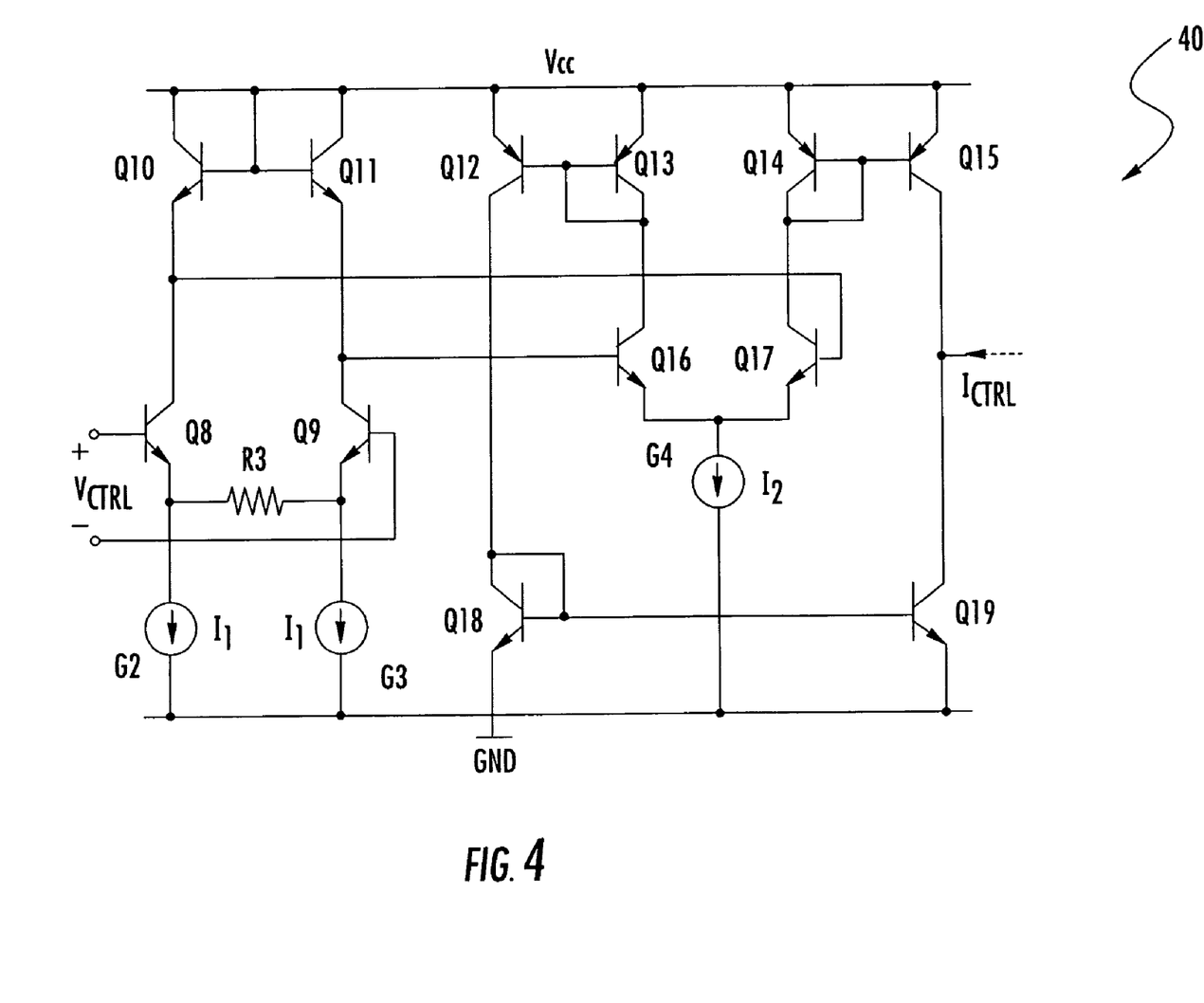
FIG. 4 shows in greater detail a particular portion of the circuit of FIG. 3.

In particular, the translinear voltage-current converter 40 allows a control current value $I_{CTRL}$ to be obtained, which complies with the following relation:

$$I_{CTRL} = \frac{I_2}{R_3 I_1} V_{CTRL} \qquad (6)$$

with $1/R_3$=a multiplicative constant depending on the structure of the translinear voltage-current converter 40;

$I_1$=a steady-temperature current value; and $I_2$=a PTAT current value.

The translinear voltage-current converter 40 is a well-known circuit and the structure thereof will not be described hereafter in detail so as not to burden the description.

In this way, the bias current $I_{POL}$ so obtained complies with the following relation:

$$I_{POL} = K_4 \frac{A_{E2}}{A_{E1}} I_{REF} \exp\left(\frac{R_2}{R_3} \frac{I_2}{I_1} \frac{V_{CTRL}}{V_T}\right) \qquad (7)$$

i.e. a biasing current $I_{POL}$ for the power transistor TX which is steady with respect to the temperature and exponentially depending on the control voltage $V_{CTRL}$. The control circuit 30 thus allows the control method according to an embodiment of the invention to be implemented and it achieves several advantages including:

it has a high integration level since it may not need external components and therefore would have neither additional costs nor off-chip losses;

it realizes a power control curve having a low slope in dB/V;

it ensures high control dynamics;

in the absence of the feedback control device (the control circuit 30 performs an open-loop control) it manages power regulation transients without stability problems.

Figure 5:
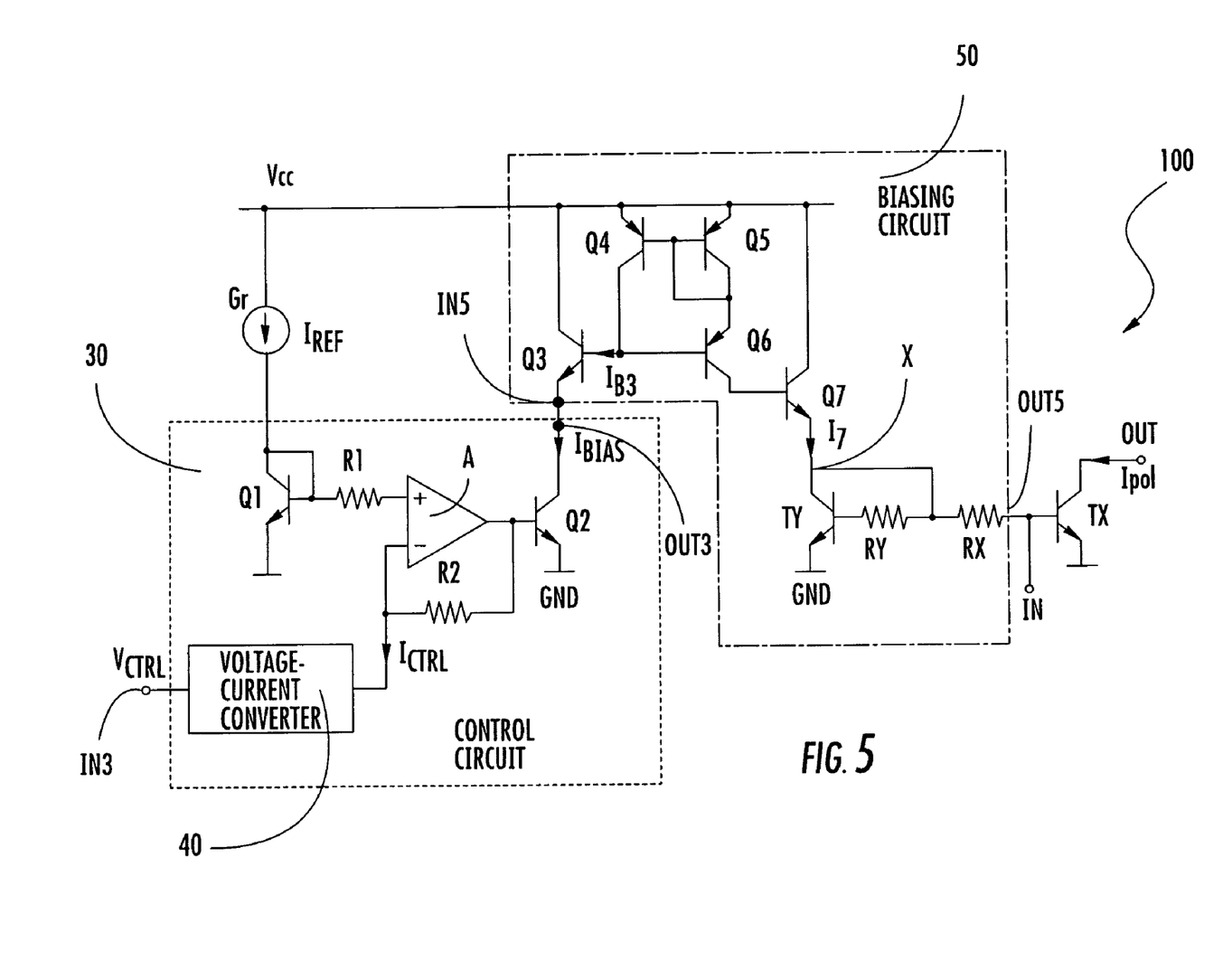
FIG. 5 schematically shows an alternative embodiment of the control circuit of FIG. 3.

The controlled system 100 also comprises the biasing circuit 50 which is realized by a convenient mirror interface, which is capable of biasing different gain stages starting from a common current reference, as shown in FIG. 5. In particular, the biasing circuit 50 is inserted between the supply voltage reference Vcc and ground GND and it has an input terminal IN5 connected to the output terminal OUT3 of the control circuit 30 and an output terminal OUT5 connected to the control terminal in of the power transistor TX.

Advantageously according to an embodiment of the invention, in view of avoiding the complementary components usually used to realize mirror devices but having a limited in-current capacity, the biasing circuit 50 has been conveniently designed. In particular, the biasing circuit 50 comprises an input transistor Q3, inserted between the supply voltage reference Vcc and the input terminal IN5 and has a control terminal connected to a current mirror realized by a first Q4, a second Q5 and a third mirror transistor Q6.

In greater detail, the first mirror transistor Q4 is inserted between the supply voltage reference Vcc and the control terminal of the input transistor Q3 and it has a control terminal connected to a control terminal of the second mirror transistor Q5, having in turn a first conduction terminal connected to the supply voltage reference Vcc, as well as a second conduction terminal connected to the control terminal thereof as well as to a first conduction terminal of the third mirror transistor Q6. This third mirror transistor Q6 has also a second conduction terminal connected to a control terminal of an output transistor Q7, inserted in turn between the supply voltage reference Vc and an internal circuit node X. Finally, the third mirror transistor Q6 has a control terminal connected to the control terminal of the input transistor Q3 and to a conduction terminal of the first mirror transistor Q4.

The biasing circuit 50 also comprises a further transistor TY which is diode-configured by a first resistor RY and inserted between the internal circuit node X and the ground GND. The diode transistor TY is also connected, by a second resistor RX, to the control terminal of the power transistor TX. Advantageously, the input transistor Q3 thus receives the current $I_{BIAS}$ as a biasing current and it provides the mirror realized by transistors Q4-Q6 with a base current $I_{B3}$ corresponding to:

$$I_{B3}=I_{BIAS}/\beta_{Q3}$$

with $\beta_{Q3}$ being the current gain of the input transistor Q3.

Therefore, the biasing current $I_7$ of the output transistor Q7 is given by:

$$I_7=I_{BIAS}\beta_{Q7}/\beta_{Q3}$$

with $\beta_{Q7}$ being the current gain of the output transistor Q7.

It should be noted that, by selecting the output transistor Q7 having an area which is n times greater than the input transistor Q3 area and a mirror factor of transistors Q4-Q6 equal to n, this results in the biasing current $I_7$ of the output transistor Q7 being equal to n times the biasing current $I_{BIAS}$ received at the input. This current $I_7$ is also a current being always steady in temperature and it can be used as a reference for the diode transistor TY which biases the power transistor TX. Moreover, advantageously according to an embodiment of the invention, to obtain a lower sensitivity of the biasing current $I_{BIAS}$ with respect to the supply voltage Vcc, it is possible to select a Wilson mirror as a complementary mirror, like the one realized by transistors Q4-Q6. The main advantage of the biasing circuit 50 shown in FIG. 5 is to minimize the silicon area globally occupied by the mirror, since the transistors Q4-Q6 use small currents, particularly the base currents of the input transistor Q3 and the output transistor Q7.

A power control circuit as previously described has been realized and tested by the Applicant for a three-gain-stage amplifier for DCS applications. In particular, this amplifier has been designed to deliver a 33 dBm power at the operating frequency of 1.8 GHz.

Figures 6A, 6B, 6C:
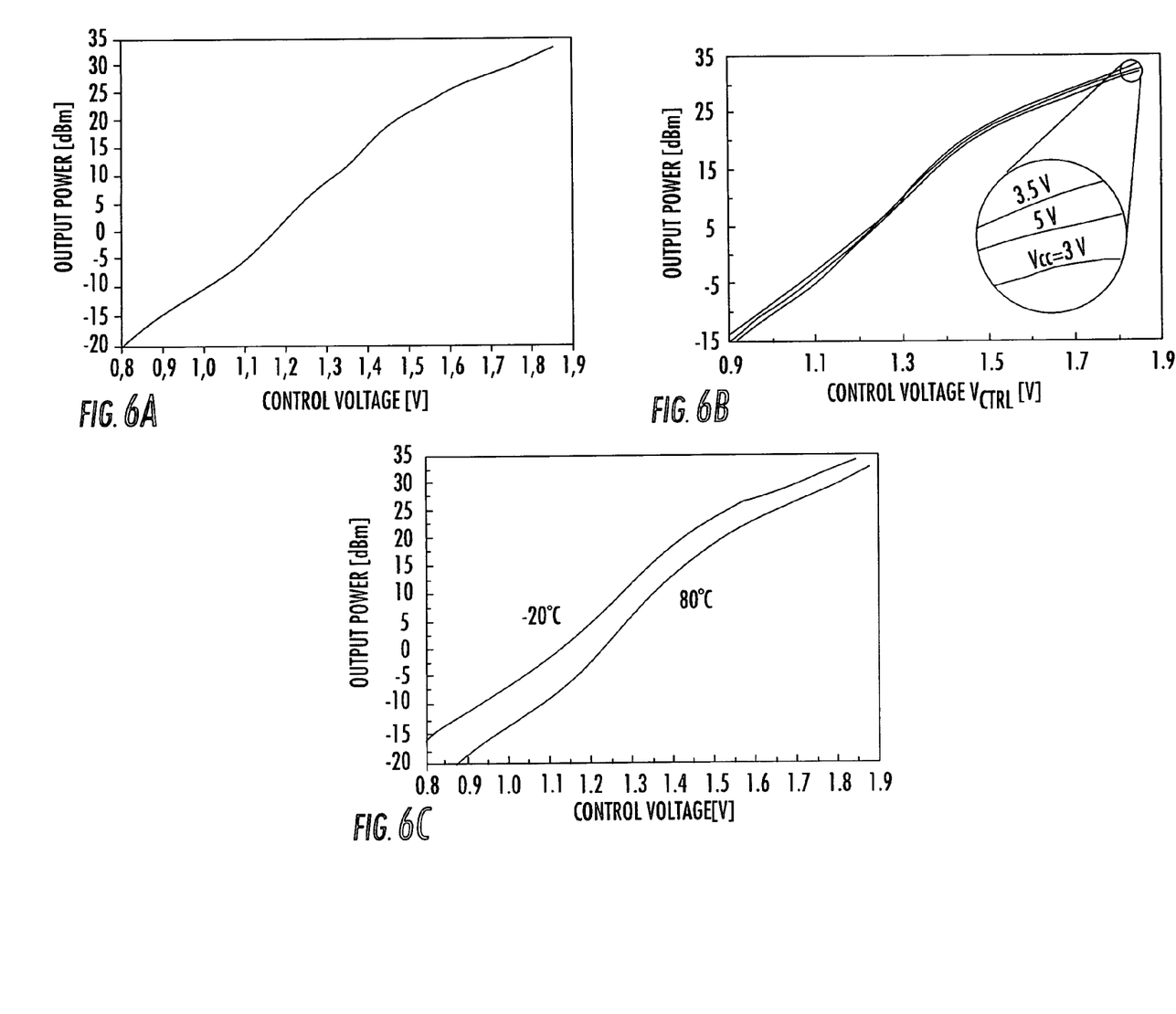
FIGS. 6A-6C show the trend of signals characterizing the circuit of FIG. 5 obtained through experimental tests.

The results of these tests are quoted in FIGS. 6A-6C. In particular, FIG. 6A shows the obtained power control curve (for Vcc=3.5V, f=1.8 GHz, Pin=0 dBm, Ta=30° C.), wherefrom it is possible to verify that the slope of this curve is lower than 80 dB/V in a power range from −20 dBm to the saturation power (33 dBm). FIG. 6B shows the output power with respect to the control voltage $V_{CTRL}$ as the supply voltage Vcc varies from 3 to 5 V (for f=1.8 GHz, Pin=0 dBm, Ta=30° C.). FIG. 6C shows the control feature when the temperature varies (for f=1.8 GHz, Pin=0 dBm, VCC=3.5V). It can be noted how the highest power variation is ±3 dB in a temperature range of −20 to 80° C.

In conclusion, the proposed control method and the control circuit allow the control of gain stages to be realized, for example, by power transistors by: a biasing current of these transistor gain stages varying according to a control voltage external to the system; and an exponential relation between the control current and the control voltage.

It should be noted that, although described with reference to power amplifiers for telecommunication applications, the present invention can be used in all applications requiring a variation of an output power level and it is independent both from the operating frequency and from the power levels being involved. From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A gain stage control method comprising:
providing a control current signal;
generating a regulation current signal related to the control current signal;
transforming the regulation current signal into a biasing current that is proportional to the regulation current signal and is related to the control current signal by an exponential law of a type $$I_{POL}=K_1 exp(K_2 I_{CTRL})$$

with:
$I_{POL}$ being the baising current,
$I_{CTRL}$ being the control current signal, and
$K_1$ and $K_2$ being multiplicative constants; and biasing the gain stage using the biasing current.

2. The control method according to claim 1 wherein the control current signal comprises a PTAT control signal.

3. The control method according to claim 1 further comprising generating the control current signal by converting a control voltage signal according to a linear relation of direct proportionality.

4. The control method according to claim 3 wherein generating the control current signal comprises:
providing a first steady-temperature current signal;
providing a second PTAT current signal; and
generating the control current signal according to a relation:

$$I_{CTRL} = K_3 \frac{I_2}{I_1} V_{CTRL}$$

with:
    $I_1$ being the first steady-temperature current signal,
    $I_2$ being the second PTAT current signal,
    $V_{CTRL}$ being the control voltage signal, and
    $K_3$ being a multiplicative constant.

5. A method for generating a biasing current for a gain stage comprising:
    generating a regulation current signal based upon a control current signal; and
    transforming the regulation current signal into a biasing current based upon the regulation current signal and so that the biasing current is related to the control current signal by an exponential law of a type:

$$I_{POL} = K_1 exp(K_2 I_{CTRL})$$

with:
    $I_{POL}$ being the biasing current,
    $I_{CTRL}$ being the control current signal, and
    $K_1$ and $K_2$ being multiplicative constants.

6. The method according to claim 5 wherein the control current signal comprises a PTAT control current signal.

7. The method according to claim 5 further comprising generating the control current signal by converting a control voltage signal according to a linear relation of direct proportionality.

8. The control method according to claim 7 wherein generating the control current signal comprises:
    providing a first steady-temperature current signal;
    providing a second PTAT current signal; and
    generating the control current signal according to a relation:

$$I_{CTRL} = K_3 \frac{I_2}{I_1} V_{CTRL}$$

with:
    $I_1$ being the first steady-temperature current signal,
    $I_2$ being the second PTAT current signal,
    $V_{CTRL}$ being the control voltage signal, and
    $K_3$ being a multiplicative constant.

9. An output power control circuit for a gain stage comprising:
    a control circuit generating a regulation current signal according to an exponential law with respect to a control voltage signal and comprising
        an input transistor having a control terminal,
        an output transistor having a control terminal, a first conduction terminal connected to a reference voltage and a second conduction terminal connected to said biasing circuit, and
        at least one operational amplifier having a first input terminal connected to the control terminal of said input transistor, a second input terminal to receive the control voltage signal, and an output terminal connected to the control terminal of said output transistor; and
    a biasing circuit connected to said control circuit and generating a biasing current for a control terminal of the gain stage according to a linear relation with respect to the regulation current signal.

10. The output power control circuit according to claim 9 wherein said input transistor comprises a first conduction terminal connected to the reference voltage and a second conduction terminal; and further comprising a reference current generator connected to said second conduction terminal of said input transistor.

11. The output power control circuit according to claim 10 wherein said reference current generator is constant with respect to temperature.

12. The output power control circuit according to claim 9 wherein said control circuit comprises a resistor connected between the control terminal of the input transistor and the first input terminal of said operational amplifier.

13. The output power control circuit according to claim 9 wherein said input transistor is diode-configured.

14. The output power control circuit according to claim 9 further comprising a feedback resistor between the output terminal of said operational amplifier and the second input terminal of said operational amplifier.

15. The output power control circuit according to claim 9 further comprising a voltage-current converter having an input terminal receiving the control voltage signal and having an output terminal for a control current signal connected to the second input terminal of the operational amplifier.

16. The output power control circuit according to claim 15 wherein said voltage-current converter comprises a translinear voltage-current converter.

17. The output power control circuit according to claim 15 wherein the control current signal comprises a PTAT control current signal.

18. The output power control circuit according to claim 17 wherein said voltage-current converter generates the control current signal according to the relation:

$$I_{CTRL} = K_3 \frac{I_2}{I_1} V_{CTRL}$$

with
    $I_{CTRL}$ being the control current signal;
    $V_{CTRL}$ being the control voltage signal;
    $I_1$ being a steady-temperature current value;
    $I_2$ being a PTAT current value; and
    $K_3$ being a multiplicative constant.

19. A wireless telecommunications device comprising:
    at least one gain stage having a control terminal;
    a control circuit generating a regulation current signal according to an exponential law with respect to a control voltage signal and comprising
        an input transistor having a control terminal,
        an output transistor having a control terminal, a first conduction terminal connected to a reference voltage and a second conduction terminal connected to said biasing circuit, and
        at least one operational amplifier having a first input terminal connected to the control terminal of said input transistor, a second input terminal to receive the control voltage signal, and an output terminal connected to the control terminal of said output transistor; and
    a biasing circuit connected to said control circuit and generating a biasing current for the control terminal of said at least one gain stage according to a linear relation with respect to the regulation current signal.

20. The wireless telecommunications device according to claim 19 wherein said input transistor comprises a first conduction terminal connected to the reference voltage and a second conduction terminal; and further comprising a reference current generator connected to said second conduction terminal of said input transistor.

21. The wireless telecommunications device according to claim 20 wherein said reference current generator is constant with respect to temperature.

22. The wireless telecommunications device according to claim 19 wherein said control circuit comprises a resistor connected between the control terminal of the input transistor and the first input terminal of said operational amplifier.

23. The wireless telecommunications device according to claim 19 wherein said input transistor is diode-configured.

24. The wireless telecommunications device according to claim 19 further comprising a feedback resistor between the output terminal of said operational amplifier and the second input terminal of said operational amplifier.

25. The wireless telecommunications device according to claim 19 further comprising a voltage-current converter having an input terminal receiving the control voltage signal and having an output terminal for a current control signal connected to the second input terminal of the operational amplifier.

26. The wireless telecommunications device according to claim 25 wherein said voltage-current converter comprises a translinear voltage-current converter.

27. The wireless telecommunications device according to claim 25 wherein the control current signal comprises a PTAT control current signal.

28. The wireless telecommunications device according to claim 27 wherein said voltage-current converter generates the control current signal according to the relation:

$$I_{CTRL} = K_3 \frac{I_2}{I_1} V_{CTRL}$$

with $I_{CTRL}$ being the control current signal;
$V_{CTRL}$ being the control voltage signal
$I_1$ being a steady-temperature current value;
$I_2$ being a PTAT current value; and
$K_3$ being a multiplicative constant.

29. A gain stage control method comprising:
providing a first control current signal;
generating a regulation current signal related to the first control current signal;
transforming the regulation current signal into a biasing current that is proportional to the regulation current signal and is related to the first control current signal by an exponential law;
biasing the gain stage using the biasing current; and
generating the first control current signal by converting a control voltage signal according to a linear relation of direct proportionality by
providing a first steady-temperature current signal,
providing a second PTAT current signal, and
generating the first control current signal according to a relation:

$$I_{CTRL} = K_3 \frac{I_2}{I_1} V_{CTRL}$$

with:
$I_{CTRL}$ being the first control current signal,
$I_1$ being the first steady-temperature current signal,
$I_2$ being the second PTAT current signal,
$V_{CTRL}$ being the control voltage signal, and
$K_3$ being a multiplicative constant.

30. A method for generating a biasing current for a gain stage comprising:
generating a regulation current signal based upon a first control current signal;
transforming the regulation current signal into a biasing current based upon the regulation current signal and so that the biasing current is related to the first control current signal by an exponential law; and
generating the first control current signal by converting a control voltage signal according to a linear relation of direct proportionality by
providing a first steady-temperature current signal,
providing a second PTAT current signal, and
generating the first control current signal according to a relation:

$$I_{CTRL} = K_3 \frac{I_2}{I_1} V_{CTRL}$$

with:
$I_{CTRL}$ being the first control current signal,
$I_1$ being the first steady-temperature current signal,
$I_2$ being the second PTAT current signal,
$V_{CTRL}$ being the control voltage signal, and
$K_3$ being a multiplicative constant.

* * * * *

UNITED STATES PATENT AND TRADEMARK OFFICE
CERTIFICATE OF CORRECTION

PATENT NO. : 7,279,978 B2 Page 1 of 1
APPLICATION NO. : 11/048200
DATED : October 9, 2007
INVENTOR(S) : Scuderi et al.

It is certified that error appears in the above-identified patent and that said Letters Patent is hereby corrected as shown below:

Column 1, Line 41  Delete: "amplifier"
 Insert: -- amplifier 11. --

Column 2, Line 58  Delete: "RDS(ON)"
 Insert: -- $R_{DS(ON)}$ --

Column 5, Line 59  Delete: "t he"
 Insert: -- the --

Column 8, Line 45  Delete: "baising"
 Insert: -- biasing --

Column 8, Line 51  Delete: "control signal"
 Insert: -- control current signal --

Column 11, Line 19  Delete: "current control"
 Insert: -- control current --

Signed and Sealed this

Twenty-fourth Day of June, 2008

JON W. DUDAS
*Director of the United States Patent and Trademark Office*